United States Patent [19]

Munits et al.

[11] 4,146,567
[45] Mar. 27, 1979

[54] ZONE MELTING APPARATUS HAVING RESILIENTLY BIASED COOLING MEANS

[76] Inventors: Ilya N. Munits, Kirovsky prospekt, 54, kv. 28; Sergei E. Maraev, ulitsa Sedova, 114, kv. 45; Vladimir P. Mikhailov, ulitsa 3 Internatsionala, 14, kv. 140, all of Leningrad, U.S.S.R.

[21] Appl. No.: 714,172

[22] Filed: Aug. 13, 1976

[51] Int. Cl.² ............................................. B01J 17/08
[52] U.S. Cl. ................................ 422/248; 156/616 R; 156/617 H
[58] Field of Search ............................ 156/616, 617 H; 14/14 ZM; 23/273 R, 273 A, 273 H, 273 Z, 273 SP; 422/248

[56] References Cited

U.S. PATENT DOCUMENTS 3,481,711  12/1969  Maruyama .......................... 156/617

FOREIGN PATENT DOCUMENTS 312438  1968  U.S.S.R. .................................. 156/616

OTHER PUBLICATIONS

Pfann, Zone Melting, John Wiley & Sons Inc., N.Y., 1958, pp. 62-77.
Schumacher, Journal of Metals, Nov. 1953, pp. 1428-1429.
Ordway, Anal. Chem., vol. 37, pp. 1178-1180, Aug. 1965.
Kennedy, The Rev. of Scien. Instru., vol. 35, #1, Jan. 1964, pp. 25-28.

*Primary Examiner*—Stephen J. Emery
*Attorney, Agent, or Firm*—Lackenbach, Lilling & Siegel

[57] ABSTRACT

A device, comprising a chamber, a container and two coolers that are arranged on the boundaries of a melted zone of a metal or semiconductor being processed. Each cooler is sectionalized, with its heat-removing elements, adjoining the container, being insulated electrically with respect to the chamber and to each other and with each section being an electrically broken element. Arranged intermediate of the coolers is a high-frequency induction heater. Said container and the high-frequency heater are mounted movably relative to each other in a longitudinal direction.

4 Claims, 3 Drawing Figures

ZONE MELTING APPARATUS HAVING RESILIENTLY BIASED COOLING MEANS

The present invention relates to devices for producing superpurity metals and semiconductor materials and more particularly to devices for zone melting of metals and semiconductors, especially of metals featuring a high heat conductivity, aluminum in particular. It may prove to be most advantageous for both vacuum zone melting and for melting in a protective gaseous atmosphere.

It is commonly known that when producing superpurity metals and semiconductors by the zone melting technique the provision during the melting process of a melted zone of constant dimensions and of high temperature gradients on the zone boundaries and on the melting and solidified fronts is of particular importance for both the quality of refining and plant output.

In order to provide higher temperature gradients on the boundaries of a melted zone the apparatus design often employs coolers arranged on both sides of a heater of the material being processed.

In terms of design, the present art zone melting devices can be subdivided into those comprising either one or a plurality of working chambers made of quartz pipes, and all-metal devices. Moreover, in terms of the melted zone formation technique these devices can be classified into those with electromagnetic induction heaters and devices, comprising heaters of other types (resistance, electron-beam heaters, etc.).

In each of the above kinds of devices the development of a cooler, whose design will provide high functional reliability and a well-balanced combination with other units of the device, presents a problem.

Thus, in devices with quartz working chambers, the coolers are usually mounted outside the pipe in view of the small difference in the respective diameters of the quartz pipe and the container. Such coolers are inefficient, since they are not in direct heat contact with the container. As to devices with metallic working chambers, they were provided with the coolers adjoining the container with the charge being processed, and similar in configuration to the container cross-section.

These coolers ensure higher temperature gradients near the melting and solidified fronts but nonuniform clearances along the external container perimeter and result in asymmetrical distribution of heat flux in an ingot being processed.

Another disadvantage of these coolers is peculiar to the zone melting plants with induction heaters powered from a high-frequency power supply source. The design of such coolers contributes to the induction of eddy (Foucault) currents which warm up the cooler with the ensuing reduction in the temperature gradient between cooler and container surfaces. This disadvantage becomes especially manifest when processing heavy ingots, since the formation of melted zones requires high power heating and, hence, the generation of high intensity electromagnetic fields.

Meanwhile the plants with metallic working chambers heated by the inductive method, ensuring high local concentration of heat energy with concurrent stirring of the melt due to electromagnetic forces, are most promising, as they provide a high output per melting cycle, as compared with the quartz chambers, wherein a considerable increase in the size of ingots placed inside said quartz pipes is unfeasible in view of a limited mechanical strength of quartz.

Thus, the problem of prime importance to be coped with during large scale zone melting is that of heat supply and removal in the course of processing metal or semiconductor ingots.

The principal object of the present invention is to provide a high production device for zone refining metals or semiconductors by using high frequency heating.

Another object of the invention is to provide a plant for zone refining of metals which obviates high temperature heating of cooler elements by an electromagnetic field generated by an inductor and would ensure a symmetrical temperature field in cross-section profile.

Still another object of the invention is to provide a zone refining plant in which heat would not be radiated into the production premises.

These and other objects of the present invention are achieved in a device for zone melting of metals and semiconductors, comprising an airtight chamber accommodating a container for material being processed, the container having at least two coolers arranged on the boundaries of a melted zone of the material being processed, and at least one high-frequency heater disposed intermediate the pair of coolers, with the container and an inductor being set up movably with respect to each other in a longitudinal direction, wherein, according to the invention, each cooler is sectionalized and in each cooler section heat-removing elements adjoining the container along its external perimeter are insulated electrically with respect to a casing and to each other, with each section being an electrically broken element.

The use of electrically disconnected sections insulated from each other and from the chamber coolers prevents the formation near the inductor of closed electrical circuits in which stray currents of high magnitude could be induced causing cooler heating owing to a high intensity, high frequency field generated by the inductor.

It is expedient that the heat removing elements of the cooler side sections be mounted movably towards the container and therefrom and be spring-biased to provide for this movement.

The mobility of the heat removing elements of the cooler sections ensures reliable heat contact between the cooler sections and external container surfaces, symmetrical heat flux in a plane normal to the longitudinal axis of the container, precluding at the same time the wedging of the container moving inside the plant.

In case the herein-proposed device is utilized for vacuum zone melting, the heat-removing elements of the side sections must be spring-biased by means of springs creating a force directed from the container, said elements being also connected to a resilient element sealing the chamber inlet zone so that upon creating a vacuum the heat-removing element will be urged tightly towards the container.

With the above embodiment of the zone melting device, the installation of the container in the device is greatly simplified. When the vacuum is not yet created in the working chamber, the springs urge the side heat removing elements of the cooler sections, with the container thereby having free access into the chamber, and upon evacuating the plant, the cooler sections are forced to the container by atmospheric pressure.

It is sound practice that the container bottom rest on the lower heat removing element of the cooler section, said element being provided with projections acting as slideways for the moving container.

The presence of slideways on the lower heat-removing elements of the cooler section precludes lateral displacement of the container during its travel and ensures a constant clearance between the container and inductor.

This precludes the possibility of direct contact between the container and inductor and makes it possible to provide a small gap between the container and the inductor sides facing it, a feature materially enhancing the electrical efficiency of the inductor-container heating system.

The nature of the invention will now be described in terms of particular embodiments in conjunction with the accompanying drawings, in which.

Figure 1:
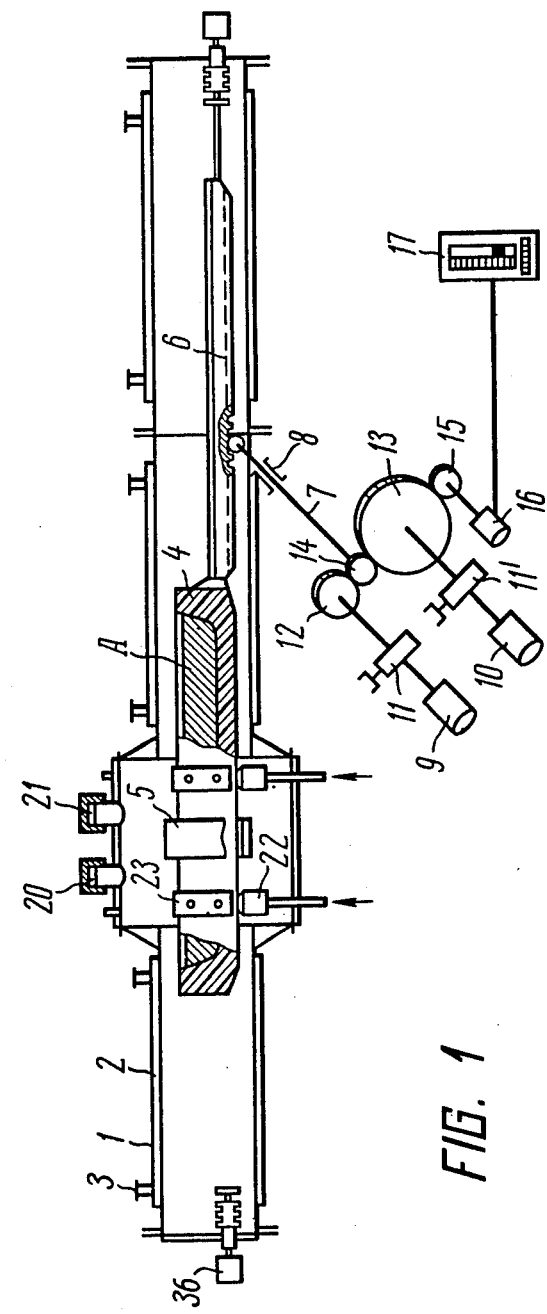
FIG. 1 is a diagrammatic longitudinal sectional view of a device for zone melting of metals.
Figure 2:
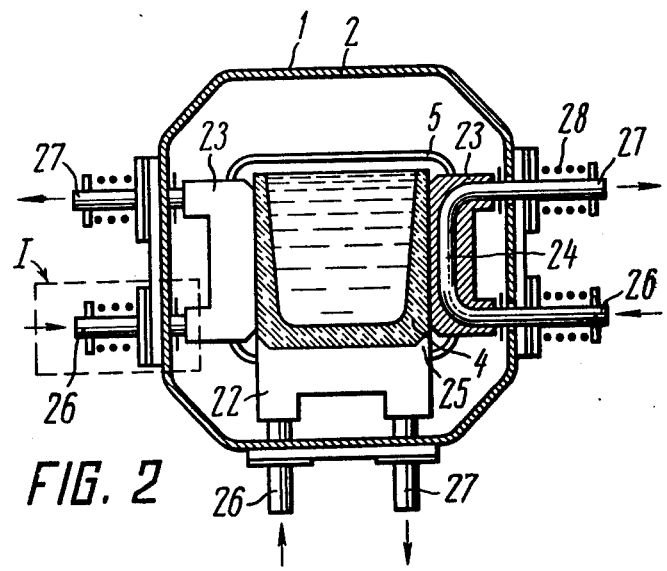
FIG. 2 is a cross-sectional view of FIG. 1.

A zone melting device (FIGS. 1 and 2) comprises a sectionalized airtight metal casing 1 fitted with hollow walls and forming an airtight chamber of the device. Spaces 2 in the walls of the casing 1 are adapted for coolant circulation and communicate through a branch pipe 3 with a source (not shown in the drawing) of said cooling medium, which may be, e.g., water. Mounted inside the casing 1 is a container 4 of a high-melting point material, chemically inert to material A being refined and placed in the container 4. Thus, in case aluminum is subjected to refining, a graphite or corundum container can be used. Arranged outside the container is a high-frequency inductor 5 encompassing said container, with an inductor supply voltage frequency being dependent on the physical properties of the container material and of the material being refined. This frequency can be selected without difficulty by a person skilled in the art.

As to an inductor power supply source (not shown in the drawing), use can be made of a converter of any type ensuring the requisite parameters as to the frequency, power and precise stabilizing of the requisite voltage and power values.

Both the inductor 5 and container 4 are mounted movably relative to each other in a longitudinal direction.

However, the displacement of said container 4 with respect to the stationary inductor 5 is preferable.

The container is set in motion by means of a drive, comprising a rack and pinion gear 6 driven by a shaft 7 passing through a vacuum seal 8.

In view of great difference in operating and reversing speeds during displacement of the container, the plant comprises two electric motors 9 and 10 whose output shafts rotate with various speeds. Said electric motors are connected through electromagnetic couplings 11 and 11' and gears 12 or 13 to a gear 14 fixed on the shaft 7 extended into the casing of the zone melting plant.

Connected to the container drive through a gear 15 is a high-speed selsyn 16 provided with a counting device 17 that is set up on a control panel to inform an operator on the container position at a given moment.

The casing 1 has inspection doors 20 and 21 adapted for visual or electron tracking of the location of boundaries of a melted zone.

The container 4 accommodating the material being processed is provided with two coolers. One of said coolers is seen more clearly in FIG. 2. Heat-removing elements of the coolers must be arranged on the boundaries of a melted zone on both sides of the inductor 5, as it can be seen in FIG. 1. The arrangement of the heat-removing elements of said coolers is determined by a possible relative length range of the melted zone which is established by calculating optimum technological conditions for refining a particular material with due account of its physicochemical properties and requirements for the final product quality.

Each cooler is sectionalized, with each section comprising one lower heat-removing element 22 and two side elements 23. Said elements 22 and 23 are essentially similar in construction and consitute an U-shaped plate made of a material featuring a high specific heat conductivity and fitted with a coolant passage 24. A distinctive feature of the lower heat-removing plate 22 resides in that it acts as a support for the container and its sections adjoining the container 4 are provided with projections 25 which serve as slideways during container travel.

The coolant is fed into the passage 24 of the heat-removing elements of the cooler along supply pipes 26 and is discharged along drain pipes 27 which act simultaneously as carriers for the cooling plates 22 and 23.

In this particular case use is made of metallic pipes 26 and 27, the spots through which they are introduced into the casing 1 being therefore insulated electrically from said casing e.g., by means of packing washers and bushings in an electrically non-conductive (insulating) material. The side sections of said coolers are kept in contact with the container walls by means of springs 28.

The lower plates 22, as it has been already stated, are essentially similar to the side plates 23 but since they serve for supporting the container 4, they are not provided with springs like those employed for urging the side plates tight to the container with the material being processed.

We have already considered hereinbefore a particular preferred embodiment of the present invention, i.e. we have shown a cooler section having an U-shaped heat-removing plate, with said sections being insulated with respect to each other and to the casing of the entire device. Both pipes are sealed at the spot where they are introduced into the section by means of an electrically non-conductive (insulating) material. However, it should be noted that the cooler sections may be variously embodied, e.g., the supply and drain pipes can be produced from an electrically non-conductive (insulating) material, of the cooling plate may have another configuration; however, in any case each section must constitute an electrically broken element, with said sections being insulated with respect to each other and to the casing walls.

Figure 3:
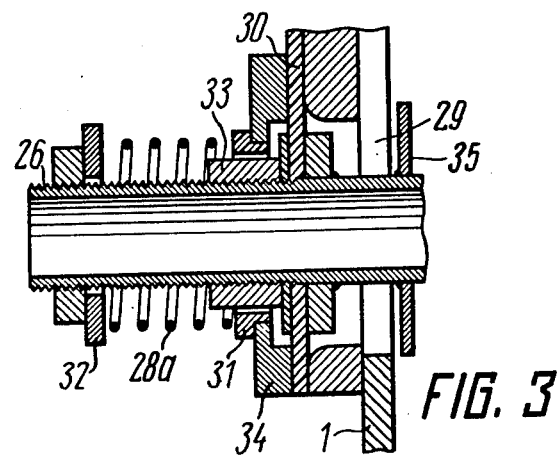
FIG. 3 shows a pipe introduction spot of a cooler section of a zone melting device adapted for vacuum melting.

Shown in FIG. 3 is a cooler section at the spot through which a coolant supply pipe is introduced (similarly to a coolant drain pipe) into said section of a cooler adapted for vacuum zone melting use. In this case the pipe is free to pass through an opening 29 in the casing 1, said opening 29 being sealed with a resilient membrane 30, e.g., in vacuum-tight rubber with the opening 27 for the passage of the pipe 26. The latter (pipe 26) is spring-biased by a spring 28a which creates force urging the cooler section from the container 4. The spring 28a and pipe 26 are electrically insulated with respect to the casing 1 by means of bushings 31, 33 and 34 and a washer 32. Fixed inside the casing 1 near its internal wall on the pipe 26 is a disc 35 which serves as a shield protecting the membrane 30 against heating. The cooler section is forced to the container owing to the deflection of said membrane 30 under the effect of a difference between the atmospheric pressure and that inside the chamber upon its evacuating.

The functioning of the proposed device will be considered briefly, since its operating principle is essentially similar to that of the other present-art zone melting devices. The operation of this device is described with regard to its particular adaptation for vacuum zone melting.

The container 4 with the charge being refined is placed in the casing 1 on the lower cooler sections 22. Next the apparatus is sealed and a vacuum is created therein. Under the effect of the atmospheric pressure the cooler side sections 23 are shifted until they are found in contact with the container walls.

By means of an auxiliary transfer drive 10 the container is brought into its initial position in which one of its end sections is introduced into the inductor 5. The latter (inductor 5) is energized and a melted zone is established on the ingot produced from the material being refined. Upon establishing the melted zone an electric motor adapted for working transfer of the container 4 is cut in with the container 4 being slowly introduced into the inductor 5 until it reaches a limit switch. At this moment the electric motor 9 and coupling 11 are switched off, the motor 10 is switched on and the corresponding coupling 11 or 11' ensures rapid backward motion of the container which returns to its initial position, whereupon the cycle, including the establishing of a melted zone and the container travel through the inductor, is reiterated. Owing to a close contact between the cooler sections and the container during zone melting, stable melting and solidified fronts are formed on the boundaries of the melted zone. This contributes to better refining of the ingots by removing impurities and provides a more perfect crystalline structure in the refined portion of the ingot.

The use of a cooler comprising electrically insulated and broken sections prevents the formation of electric circuits resulting in undesirable heating of the cooler by a high-frequency field, a feature providing better processing of materials and cutting down the process time.

What we claim is:

1. A device for zone melting of metals and semiconductors, comprising an airtight chamber, a container accommodating a material being processed, made of a high-melting point material and arranged in said sealed chamber, at least two coolers adapted to be disposed on the boundaries of a melted zone of said material being processed, with each of said coolers being sectionalized and having heat-removing elements adjoining the container along its external perimeter, movably mounted and spring biased to urgingly contact the container to provide a symmetrical distribution of heat flux, said heat-removing elements being insulated electrically with respect to each other and to a casing and with each section being an electrically broken element, high-frequency induction heaters, equal in number to that of cooler pairs, each said heater being set up intermediate of at least one said pair of the coolers, a means for relative displacement of said container and heater in a longitudinal direction.

2. A device according to claim 1, in which the heat-removing elements are fixed on coolant supply pipes which are introduced into the chamber through its walls and are insulated electrically from the casing at the point of introduction.

3. A device according to claim 1, in which in the section of introduction of said pipes, the latter are fixed on the resilient element sealing the spot through which they are extended into the chamber, and ensuring the interconnection between said resilient and heat-removing elements and the displacement of the latter when creating a vacuum therein.

4. A device according to claim 1, in which a lower cooler heat-removing element is fitted with projections acting as slideways along which is moving the container arranged with its bottom on said heat-removing element.

* * * * *